(12) United States Patent
Wang et al.

(10) Patent No.: US 8,227,840 B2
(45) Date of Patent: Jul. 24, 2012

(54) INTEGRATED CIRCUIT DEVICE AND METHOD OF FORMING THE SAME

(75) Inventors: Charles C. Wang, Taipei (TW); Shing Hwa Renn, Taipei (TW); Sheng Kang Luo, Hsinchu County (TW)

(73) Assignee: Nanya Technology Corp. (TW)

( * ) Notice: Subject to any disclaimer, the term of this patent is extended or adjusted under 35 U.S.C. 154(b) by 136 days.

(21) Appl. No.: 12/954,284

(22) Filed: Nov. 24, 2010

(65) Prior Publication Data
US 2012/0126412 A1 May 24, 2012

(51) Int. Cl.
*H01L 29/80* (2006.01)
(52) U.S. Cl. .................. 257/276; 257/E29.119
(58) Field of Classification Search .......... 257/276, 257/675, 718, 720, E29.119; 438/122
See application file for complete search history.

(56) References Cited

U.S. PATENT DOCUMENTS

| | | | |
|---|---|---|---|
| 6,573,565 B2 * | 6/2003 | Clevenger et al. | ............ 257/355 |
| 7,738,249 B2 | 6/2010 | Chan et al. | |

* cited by examiner

*Primary Examiner* — Quoc Hoang
(74) *Attorney, Agent, or Firm* — Connolly Bove Lodge & Hutz LLP

(57) ABSTRACT

An integrated circuit device includes a semiconductor substrate having a first region and second region, a conductive via positioned in the first region of the semiconductor substrate, at least one active element positioned in the second region of the semiconductor substrate, a conductive layer extending from the first region to the second region and electrically connecting the conductive via to the active element, and an auxiliary structure positioned in the first region of the semiconductor substrate and proximate to the conductive via. The auxiliary structure can be a stress-absorbing structure, and the volume of the stress-absorbing structure decreases as the volume of the conductive via increases. The auxiliary structure can be a heat-evacuating structure, and the heat-evacuating structure is configured to transfer the operating heat generated by the active element from the first region of the semiconductor substrate to the conductive via through the conductive layer.

13 Claims, 11 Drawing Sheets

INTEGRATED CIRCUIT DEVICE AND METHOD OF FORMING THE SAME

BACKGROUND OF THE INVENTION

The present invention relates to an integrated circuit device. More particularly, the present invention relates to an integrated circuit device having a through-silicon via (TSV) and an auxiliary structure proximate to the TSV for reducing the thermal influence from the operating heat of the active element.

Packaging technology for integrated circuit devices has been continuously improved to meet the demand for miniaturization and mounting reliability. Recently, as the miniaturization and high functionality of electric and electronic products are required, various techniques have been disclosed in the art.

By using a stack of at least two chips, in the case of a memory device for example, it is possible to produce a product having a memory capacity which is twice as large as that obtainable through semiconductor integration processes. Also, a stacked package provides advantages not only of an increase in memory capacity but also in regards to mounting density and mounting area utilization efficiency. Due to such advantages, research and development of stacked package technology has accelerated.

As an example of a stacked package, a through-silicon via (TSV) has been disclosed in the art. The stacked package using a TSV has a structure in which the TSV is disposed in a chip so that chips are physically and electrically connected with each other through the TSV. Generally, a TSV is formed by etching a vertical via through a substrate and filling the via with a conductive material, such as copper. To increase the transmission speed and for high-density fabrication, the thickness of a semiconductor wafer comprising multiple integrated circuit devices each having the TSV should be reduced.

SUMMARY OF THE INVENTION

An aspect of the present invention is to provide an integrated circuit device having a through-silicon via (TSV) and auxiliary structure proximate to the TSV for reducing the thermal influence from the operating heat of the active element.

According to one embodiment of the present invention, the integrated circuit device comprises a semiconductor substrate having a first region and second region, a conductive via positioned in the first region of the semiconductor substrate, a dielectric layer electrically separating the conductive via from the semiconductor substrate, at least one active element positioned in the second region of the semiconductor substrate, a conductive layer extending from the first region to the second region and electrically connecting the conductive via to the active element, and an auxiliary structure positioned in the first region of the semiconductor substrate and proximate to the conductive via. The auxiliary structure can be a stress-absorbing structure, and the volume of the stress-absorbing structure decreases as the volume of the conductive via increases. The auxiliary structure can be a heat-evacuating structure, and the heat-evacuating structure is configured to transfer the operating heat generated by the active element from the first region of the semiconductor substrate to the conductive via through the conductive layer.

The foregoing has outlined rather broadly the features and technical advantages of the present invention in order that the detailed description of the invention that follows may be better understood. Additional features and advantages of the invention will be described hereinafter, and form the subject of the claims of the invention. It should be appreciated by those skilled in the art that the conception and specific embodiment disclosed may be readily utilized as a basis for modifying or designing other structures or processes for carrying out the same purposes as those of the present invention. It should also be realized by those skilled in the art that such equivalent constructions do not depart from the spirit and scope of the invention as set forth in the appended claims.

BRIEF DESCRIPTION OF THE DRAWINGS

The accompanying drawings, which are incorporated in and constitute a part of this specification, illustrate embodiments of the disclosure and, together with the description, serve to explain the principles of the invention.

DETAILED DESCRIPTION OF THE INVENTION

There are two key challenges that need to be addressed in the application of the TSV technique to integrated circuit devices, i.e., the thermal evacuation and the thermal stress. The thermal evacuation is severe due to the much higher density of the active devices per unit volume. The TSV can serve as a thermal evacuation channel, thanks to the high thermal conductivity of the TSV metal (usually copper). However, a thick insulator (usually oxide) exists between the silicon substrate and the TSV metal as electrical isolation. Usually the insulator's thermal conductivity is very low (i.e. oxide's Kox is approximately 1.4 W/m K), limiting the TSV's ability to transmit heat.

As to the thermal stress, the TSV generates thermal stress in its surrounding due to very large differences in the coefficient of thermal expansion (CTE) between the metal of the TSV and the silicon substrate. The large difference in CTE between the metal (16.4 E-6/° C. for Cu) of the TSV and the silicon substrate (2.6 E6/° C.) generates thermal stress around the TSV. Electrically, the mobility of transistors near the TSV is strongly impacted. In addition, this large difference also produces problems during wafer processing due to the uncontrolled increase in wafer bow/warp after copper annealing.

Figure 1:
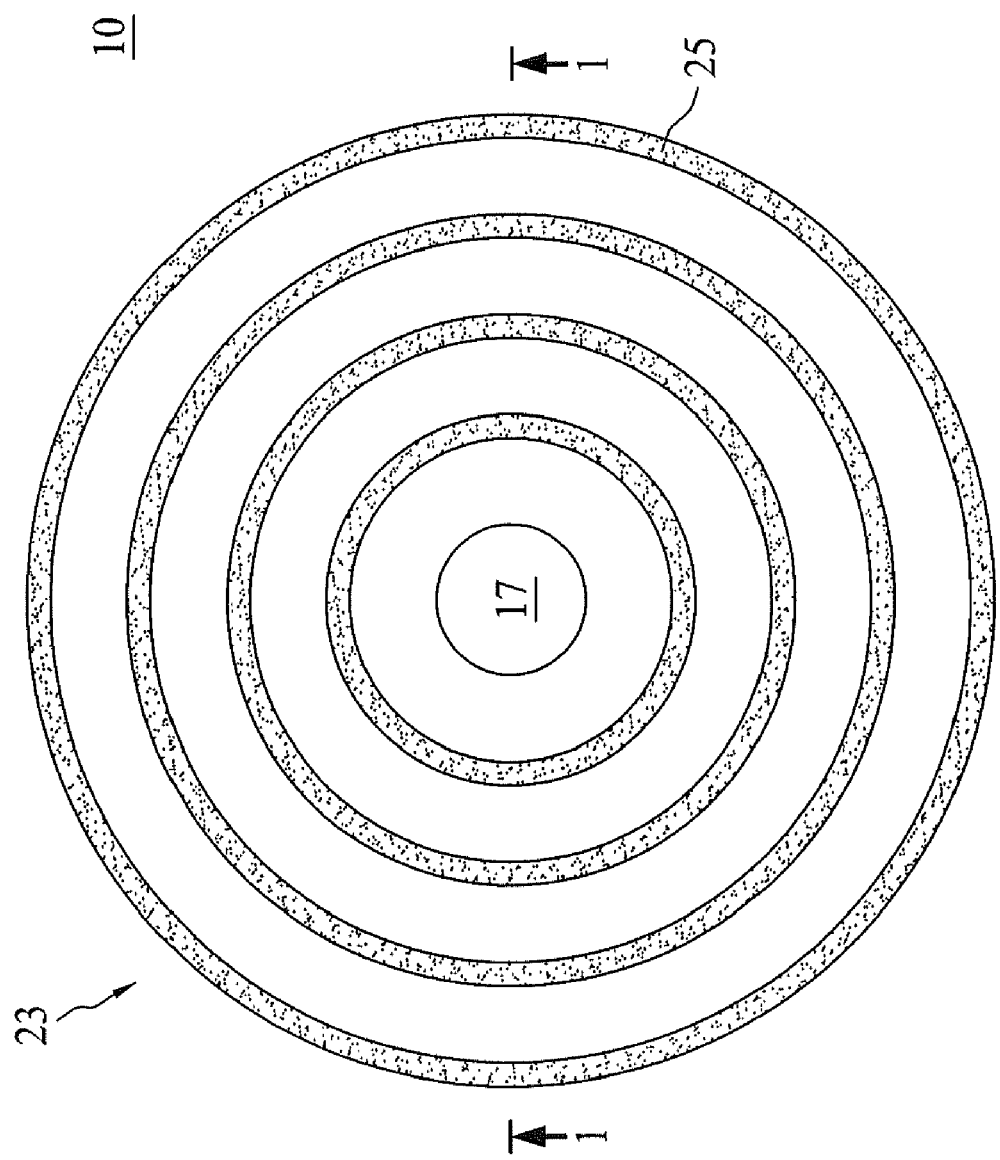
FIG. 1 is a top view of an integrated circuit device in accordance with one embodiment of the present invention.
Figure 2:
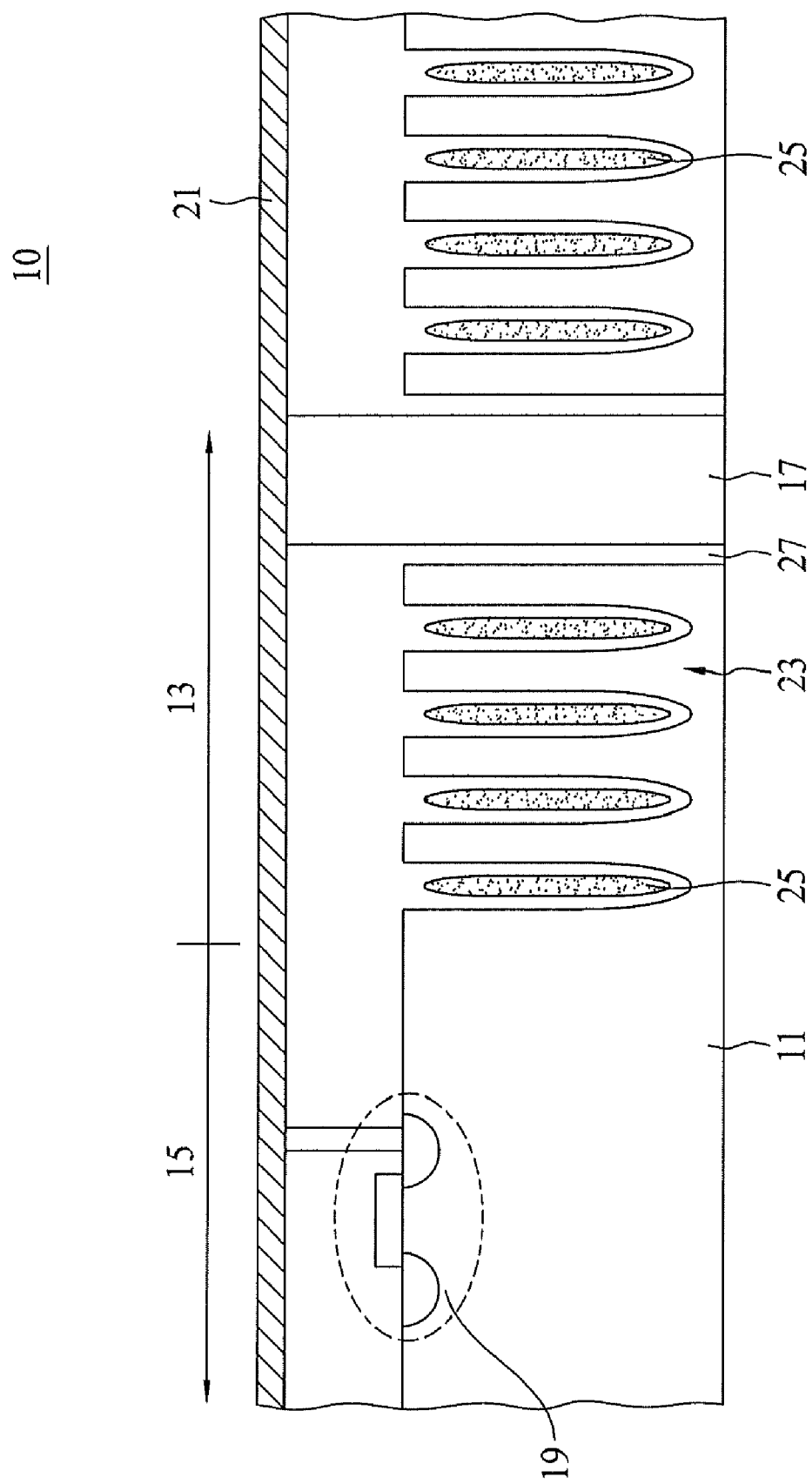
FIG. 2 is a cross-sectional view along the sectional line 1-1 in FIG. 1.

FIG. 1 is a top view showing a portion of an integrated circuit device 10 in accordance with one embodiment of the present invention, and FIG. 2 is a cross-sectional view along the sectional line 1-1 in FIG. 1. In one embodiment of the present invention, the integrated circuit device 10 comprises a semiconductor substrate 11 having a first region 13 and a second region 15, a conductive via (TSV) 17 positioned in the first region 13 of the semiconductor substrate 11, at least one active element 19 such as a transistor positioned in the second region 15 of the semiconductor substrate 11, a conductive layer 21 extending from the first region 13 to the second region 15 and electrically connecting the conductive via 17 to the active element 19, and an auxiliary structure 23 such as a stress-absorbing structure positioned in the first region 13 of the semiconductor substrate 11 and proximate to the conductive via 17 (for example, between the conductive via 17 and the active element 19). In one embodiment of the present invention, the auxiliary structure 23 is configured to reduce the thermal influence from the operating heat of the active element 19, and includes a plurality of rings 25 arranged concentrically around the conductive via 17, wherein the rings 25 can be air gaps or flexible material embedded in the semiconductor substrate 11.

In another embodiment of the present invention, the auxiliary structure 23 includes at least one conductive element (ring) 25 and a dielectric element 27 sandwiched between the conductive element 25 and the semiconductor substrate 11. In one embodiment of the present invention, the conductive element 25 is surrounded and encapsulated by the dielectric element 27.

Figure 3:
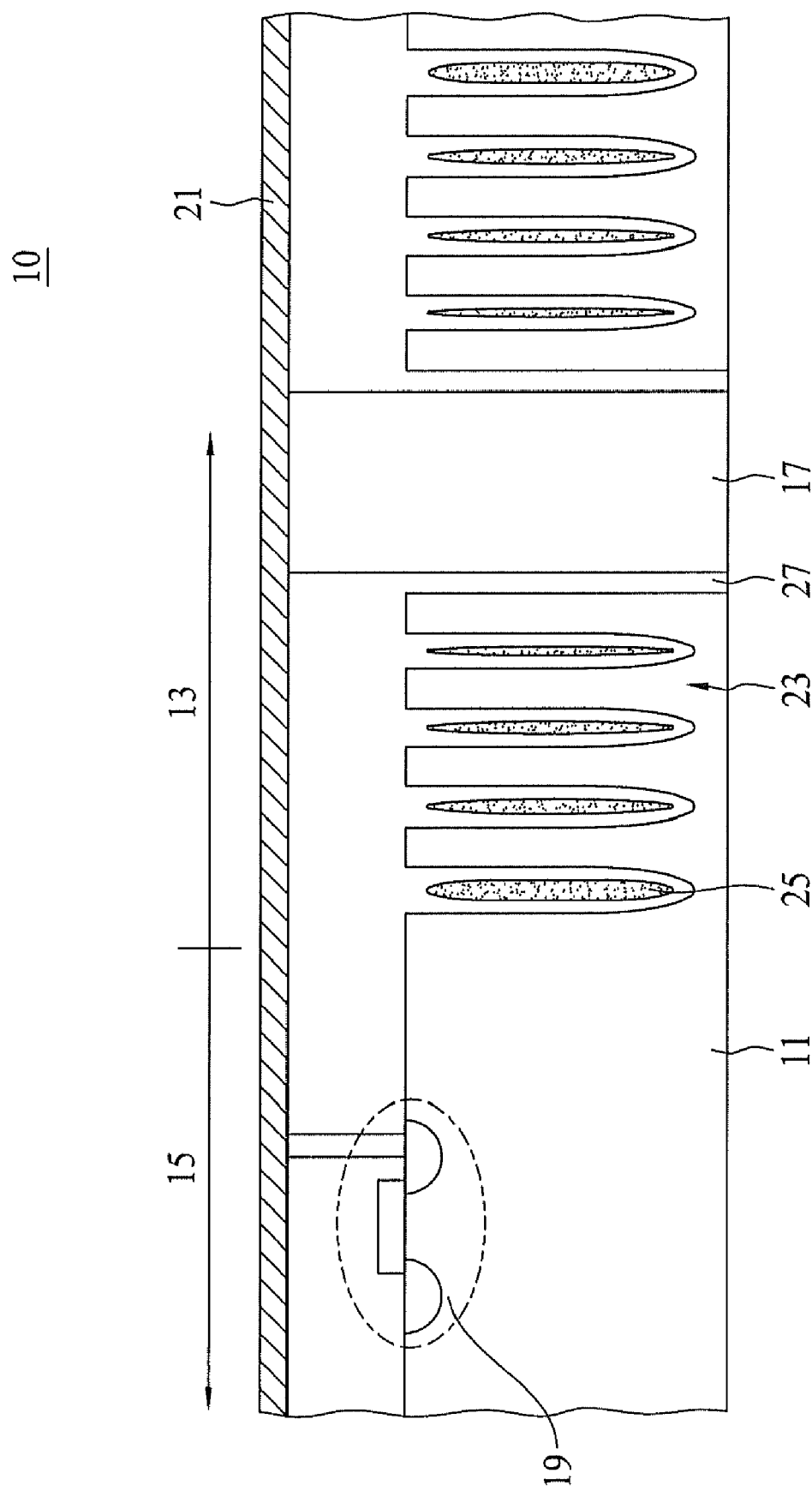
FIG. 3 is a cross-sectional view along the sectional line 1-1 in FIG. 1, showing the structural variation of the integrated circuit device in accordance with one embodiment of the present invention.

FIG. 3 is a cross-sectional view along the sectional line 1-1 in FIG. 1, showing the structural variation of the integrated circuit device 10 in accordance with one embodiment of the present invention. The operation of the active element 19 generates heat, which increases the temperature of the integrated circuit device 10. As a result, the width of the conductive via 17 increases as the temperature increases to generate stress. The rings 25 of the stress-absorbing structure 23 shrink as the conductive via 17 expands laterally to absorb the generated stress. In other words, the volume of the stress-absorbing structure 23 decreases as the volume of the conductive via 17 increases to absorb the generated stress.

Figure 4:
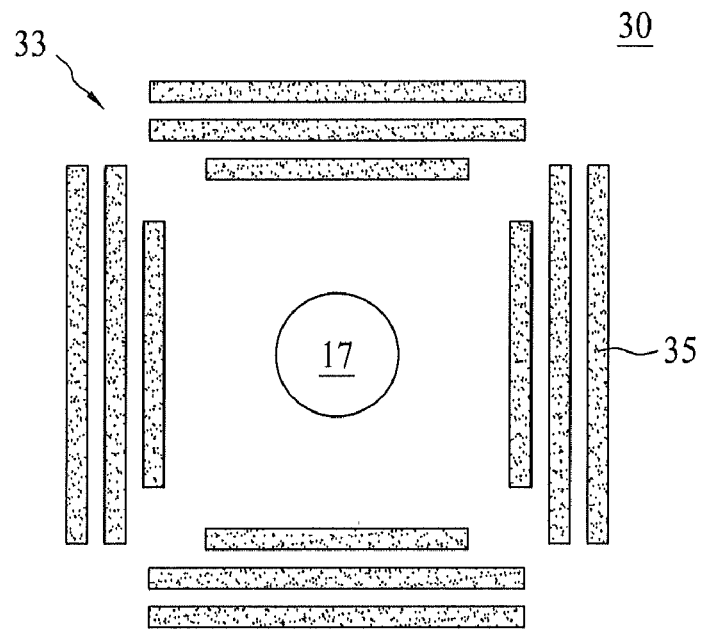
FIG. 4 is a top view showing a portion of an integrated circuit device in accordance with one embodiment of the present invention.

FIG. 4 is a top view showing a portion of an integrated circuit device 30 in accordance with one embodiment of the present invention. Compared to the integrated circuit device 10 in FIG. 1, which uses the concentric rings 25 to implement the stress-absorbing structure 23, the integrated circuit device 30 uses a plurality of parallel trenches 35 around the conductive via 17 to implement the stress-absorbing structure 33.

Figure 5:
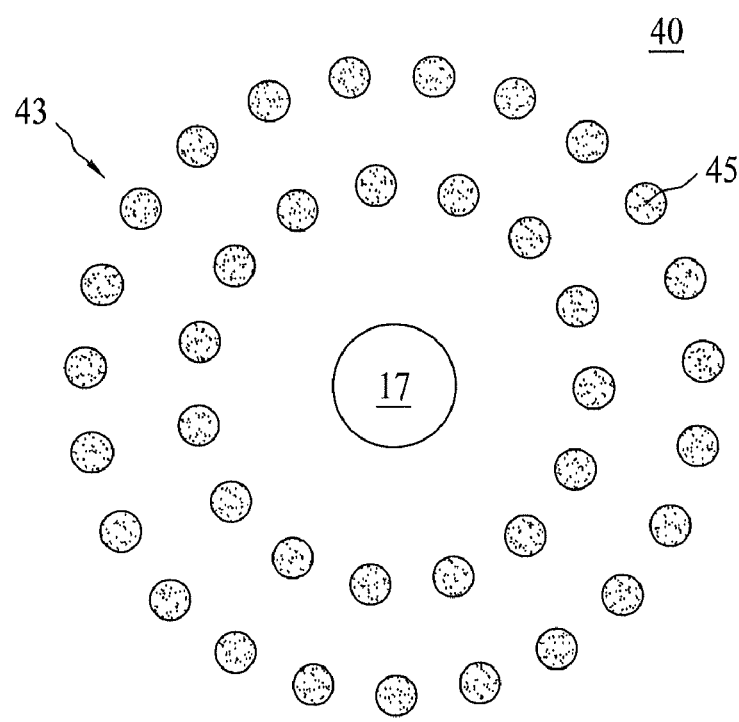
FIG. 5 is a cross-sectional view along the sectional line 1-1 in FIG. 1, showing the structural variation of the integrated circuit device in accordance with one embodiment of the present invention.

FIG. 5 is a top view showing a portion of an integrated circuit device 40 in accordance with one embodiment of the present invention. Compared to the integrated circuit device 10 in FIG. 1, which uses the concentric rings 25 to implement the stress-absorbing structure 23, the integrated circuit device 40 uses a plurality of holes 45 arranged concentrically around the conductive via 17 to implement the stress-absorbing structure 43.

Figure 6:
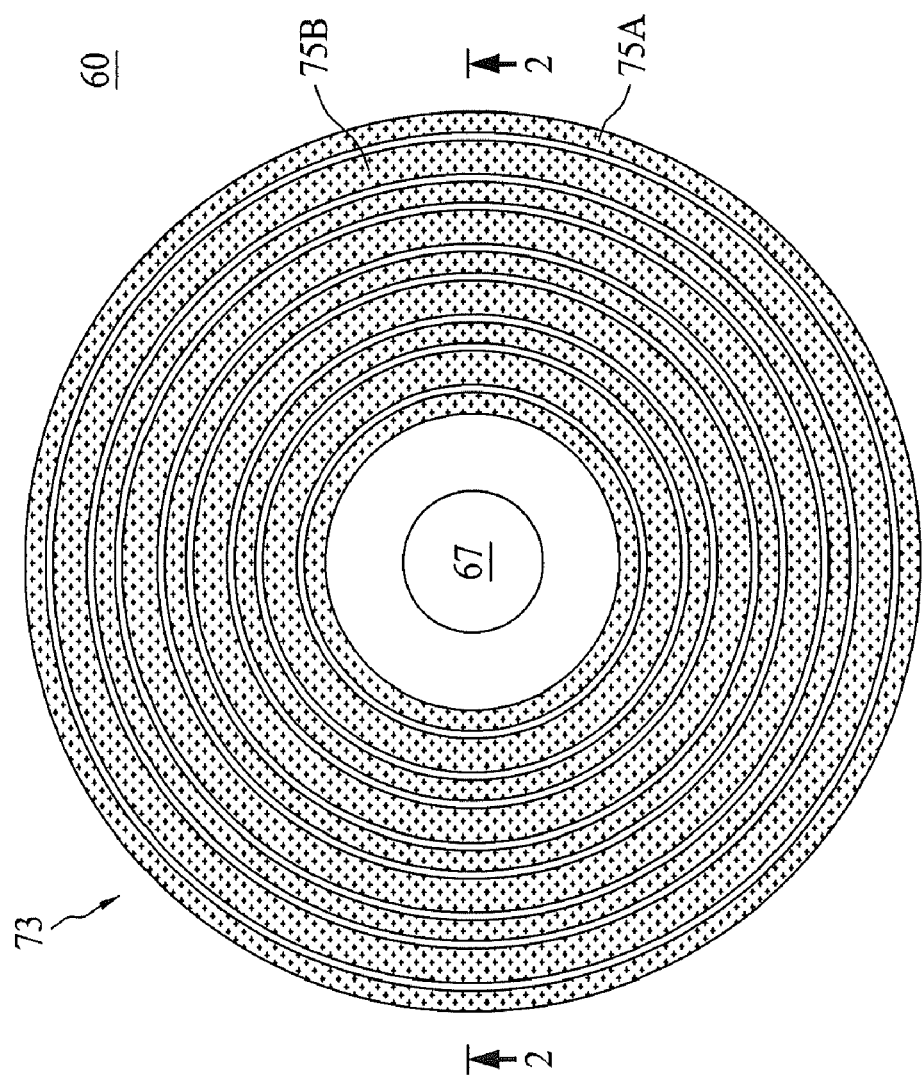
FIG. 6 is a top view showing a portion of an integrated circuit device in accordance with one embodiment of the present invention.
Figure 7:
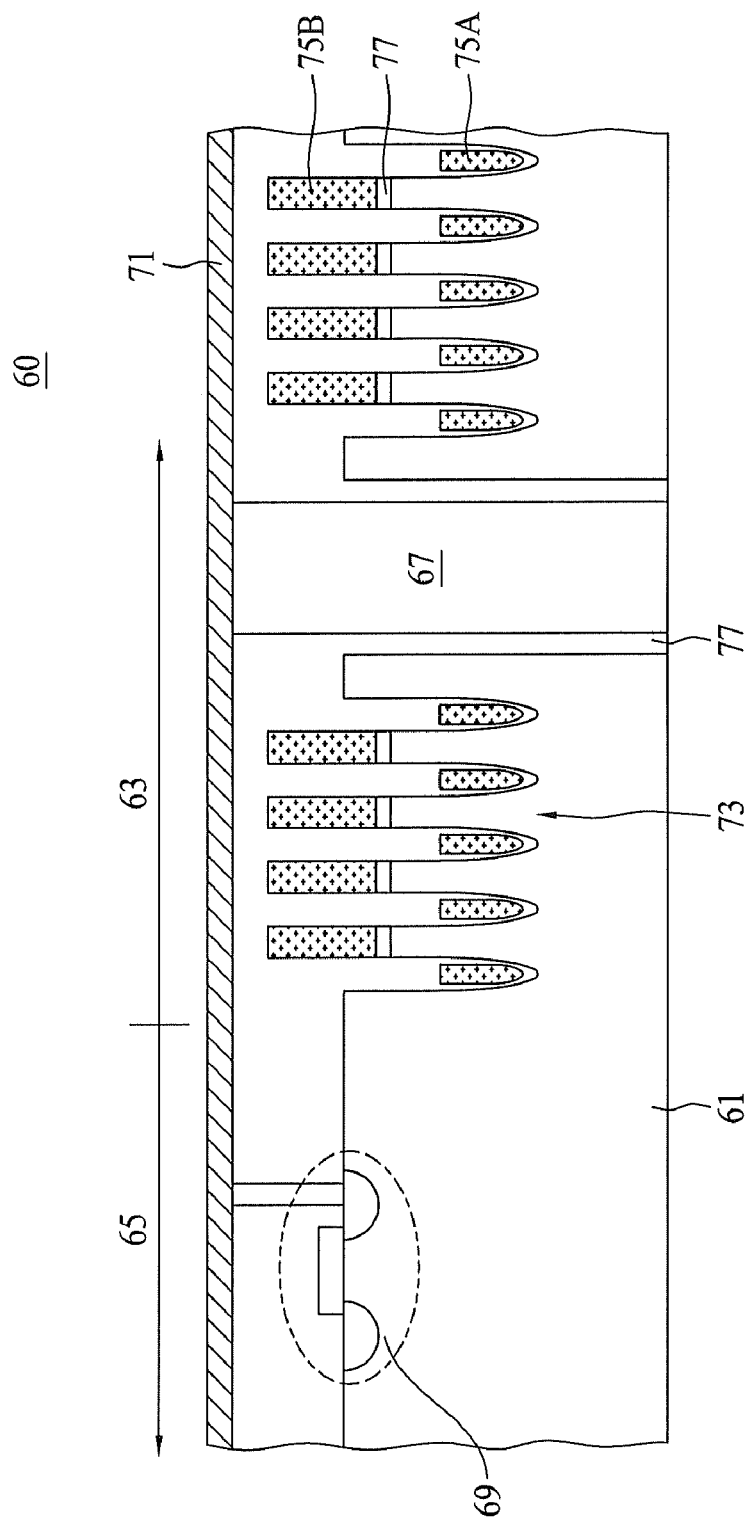
FIG. 7 is a cross-sectional view along the sectional line 2-2 in FIG. 6.

FIG. 6 is a top view showing a portion of an integrated circuit device 60 in accordance with one embodiment of the present invention, and FIG. 7 is a cross-sectional view along the sectional line 2-2 in FIG. 6. In one embodiment of the present invention, the integrated circuit device 60 comprises a semiconductor substrate 61 having a first region 63 and a second region 65, a conductive via (TSV) 67 positioned in the first region 13 of the semiconductor substrate 61, at least one active element 69 such as a transistor positioned in the second region 65 of the semiconductor substrate 61, a conductive layer 71 extending from the first region 63 to the second region 65 and electrically connecting the conductive via 67 to the active element 69, a dielectric layer 77 electrically separating the conductive via 67 from the semiconductor substrate 61, and an auxiliary structure 73 such as a heat-evacuating structure positioned in the first region 63 of the semiconductor substrate 61 and proximate to the conductive via 67 (for example, between the conductive via 67 and the active element 69.

In one embodiment of the present invention, the auxiliary structure 73 structure 73 is configured to reduce the thermal influence from the operating heat of the active element 69, and includes at least one first block (metal ring) 75A and second block (metal ring) 75B including tungsten arranged concentrically around the conductive via 67, wherein the metal ring 75A are positioned in a lower portion of the semiconductor substrate 61 and the metal ring 75B are positioned in a higher portion of the semiconductor substrate 61. In one embodiment of the present invention, the dielectric layer 77 separates the metal rings 75A and 75B from the semiconductor substrate 61. In another embodiment of the present invention, the auxiliary structure 73 includes a plurality of conductive elements (rings) 75A, 75B and the dielectric element 77 is sandwiched between the conductive elements 75A, 75B and the semiconductor substrate 61. In one embodiment of the present invention, the conductive elements 75A, 75B are surrounded and encapsulated by the dielectric element 77.

Figure 8:
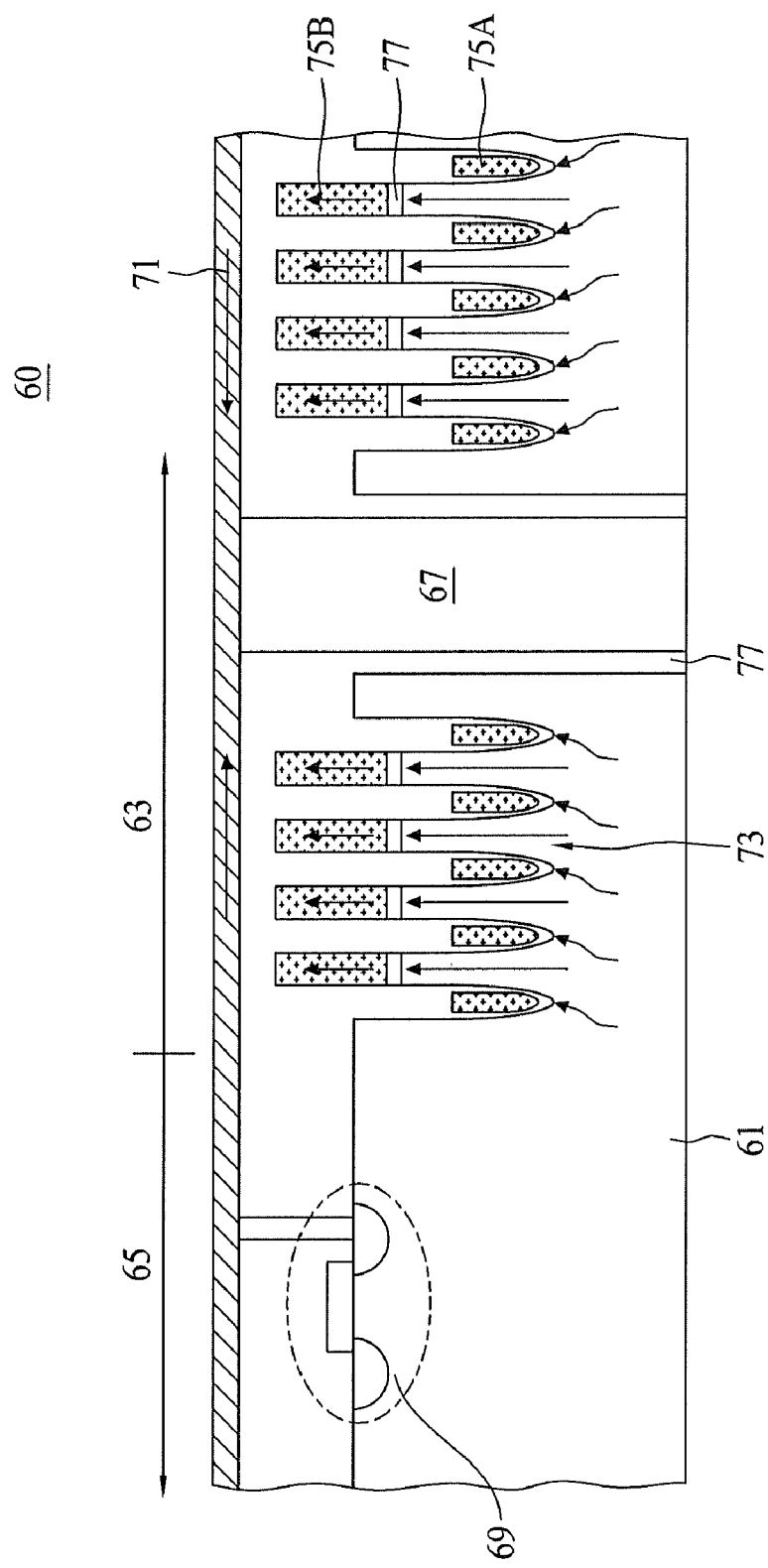
FIG. 8 is a cross-sectional view along the sectional line 2-2 in FIG. 6.

FIG. 8 is a cross-sectional view along the sectional line 2-2 in FIG. 6, showing the heat-evacuating path of the integrated circuit device 60 in accordance with one embodiment of the present invention. In one embodiment of the present invention, the operation of the active element 69 generates heat, which is transferred to the outside of the integrated circuit device 60 from the second region 65 of the semiconductor substrate 61 through the heat-evacuating structure 73, the conductive layer 71, and the conductive via 67, as shown by the arrows in FIG. 8.

Figure 9:
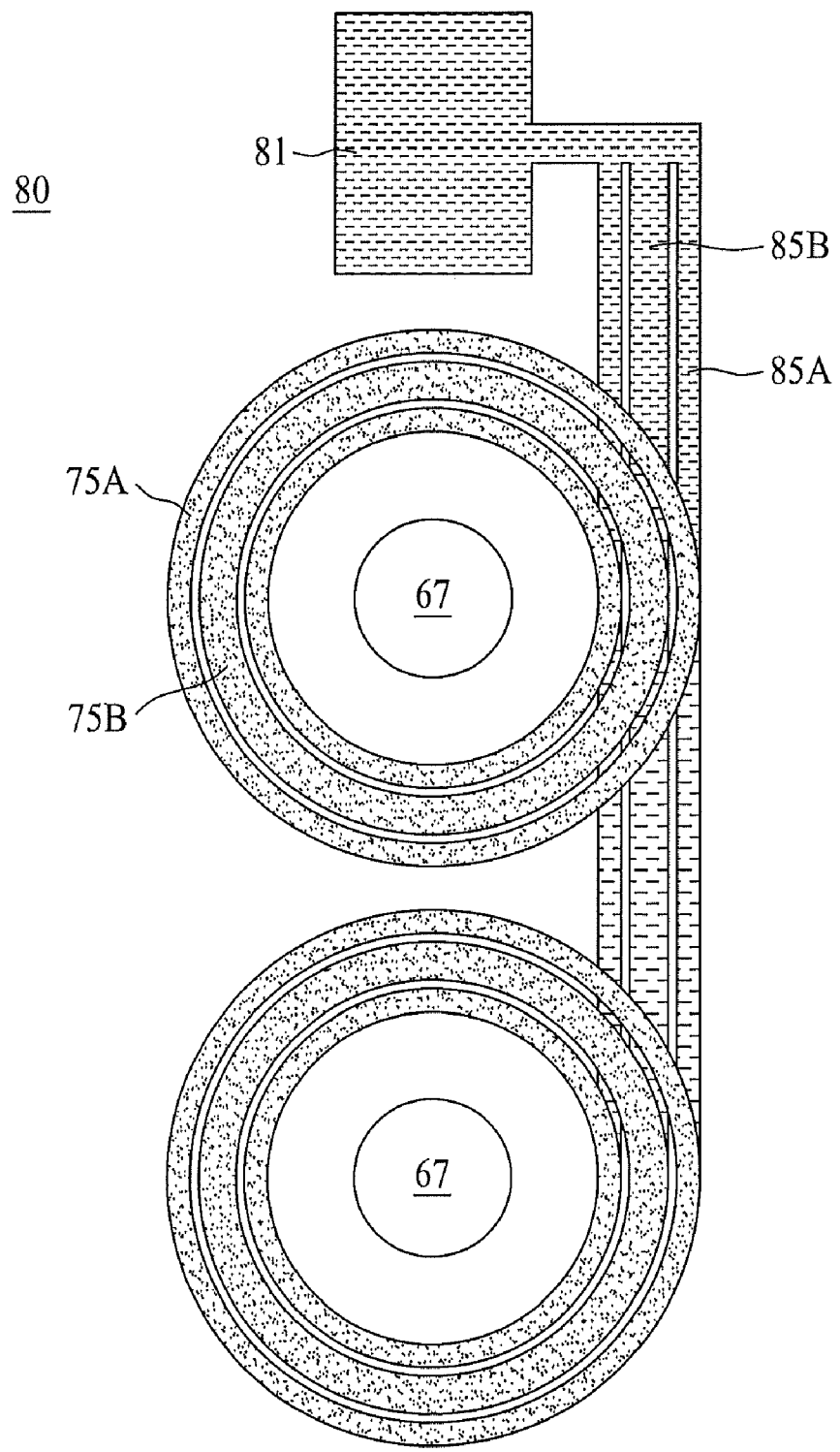
FIG. 9 is a schematic view of an integrated circuit device in accordance with one embodiment of the present invention.

FIG. 9 is a schematic view of an integrated circuit device 80 in accordance with one embodiment of the present invention. Compared to the integrated circuit device 60 in FIG. 7, which evacuates the operating heat generated by the active element 69 from the second region 65 of the semiconductor substrate 61 through the conductive layer 71, the integrated circuit device 80 further comprises a pad 81 and a plurality of metal lines 85A and 85B connecting the metal rings 75A and 75B (metal blocks) to the pad 81 such that the operating heat generated by the active element 69 is evacuated primarily from the second region 65 of the semiconductor substrate 61 through the metal rings 75A and 75B of the heat-evacuating structure 73, the metal lines 85A and 85B, and the pad 81.

Figure 10:
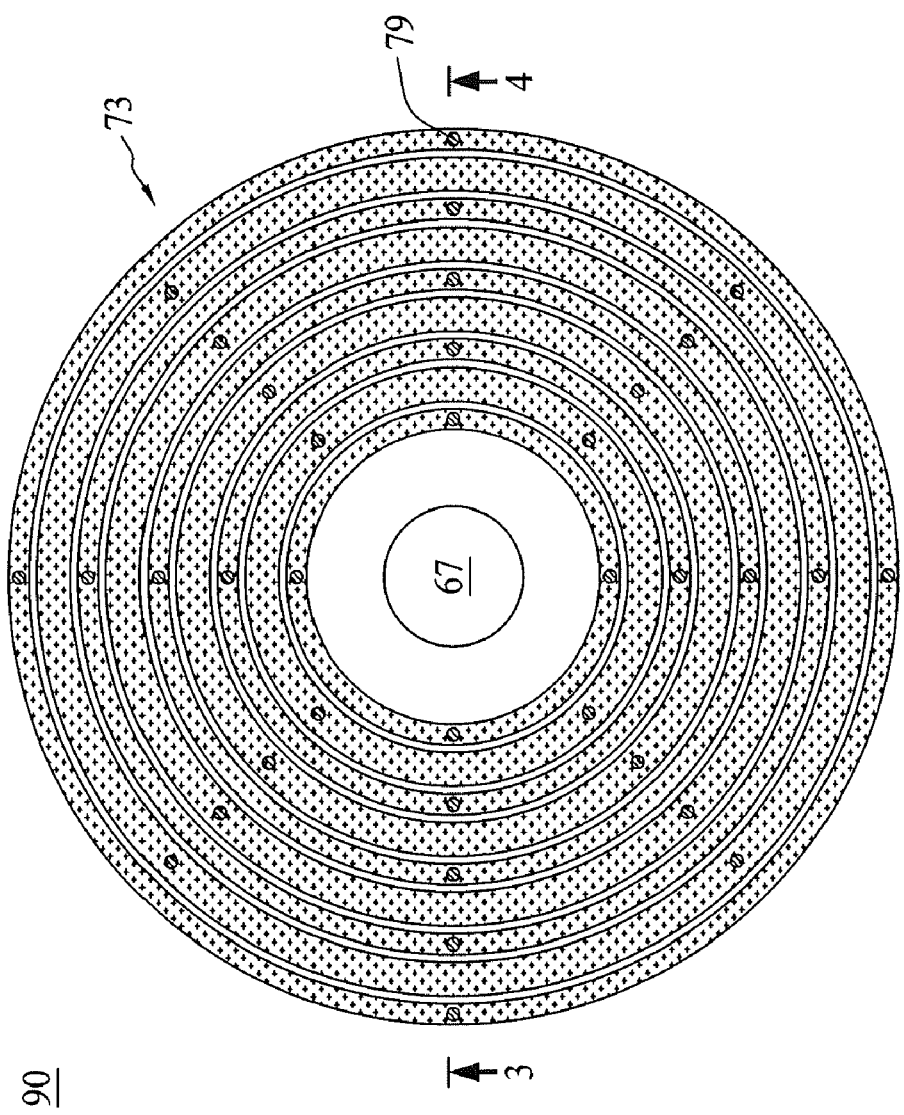
FIG. 10 is a top view showing a portion of an integrated circuit device in accordance with one embodiment of the present invention.
Figure 11:
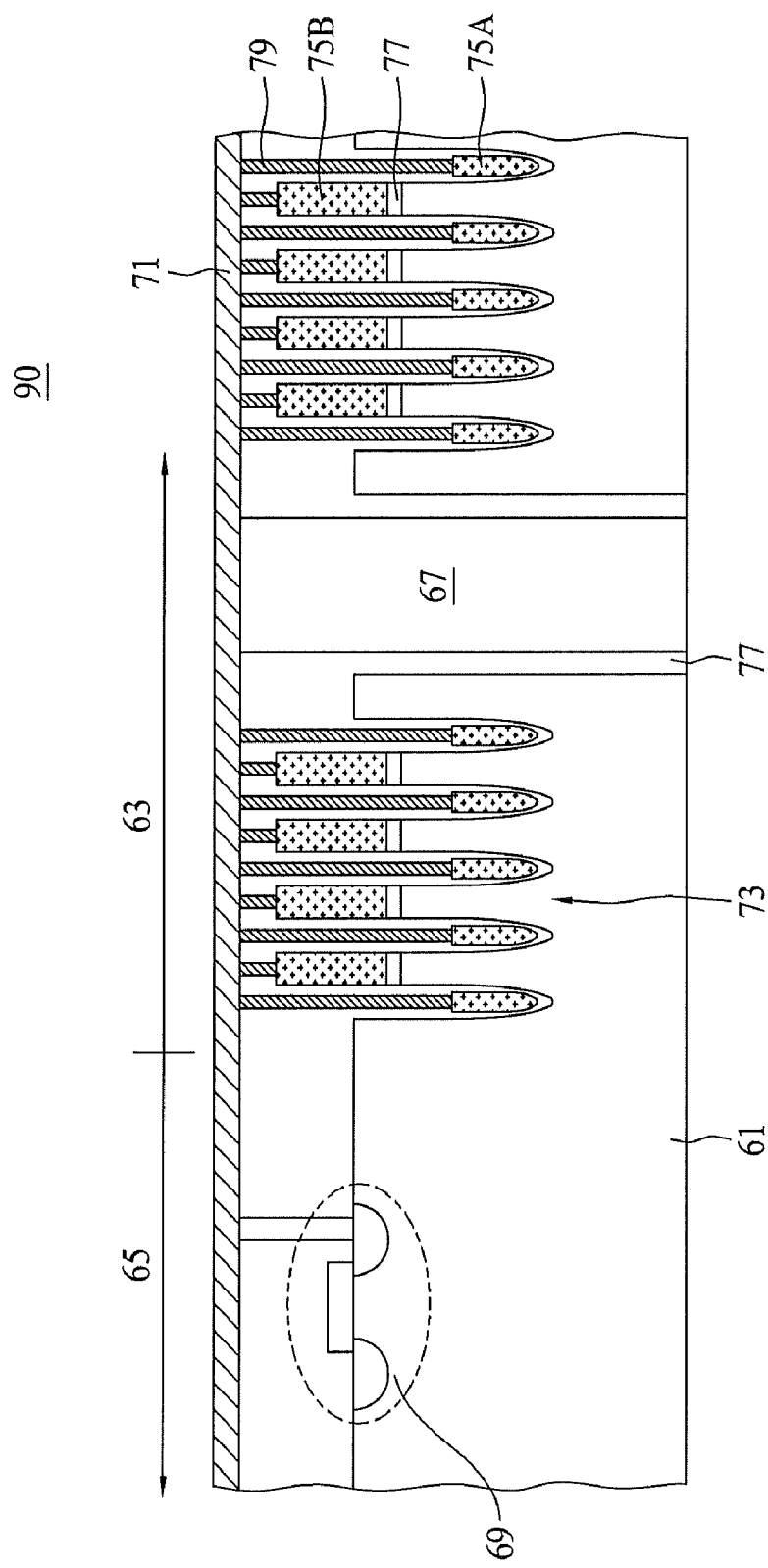
FIG. 11 is a cross-sectional view along the sectional line 3-3 in FIG. 10.

FIG. 10 is a top view showing a portion of an integrated circuit device 90 in accordance with one embodiment of the present invention, and FIG. 11 is a cross-sectional view along the sectional line 3-3 in FIG. 10. Compared to the integrated circuit device 60 in FIG. 7, which has no heat-conducting element connecting the metal rings 75A and 75B to the conductive layer 71, the integrated circuit device 90 further comprises a plurality of conducting plugs 79 connecting the metal rings 75A and 75B (the metal blocks) of the auxiliary structure 73 to the conductive layer 71.

Figure 12:
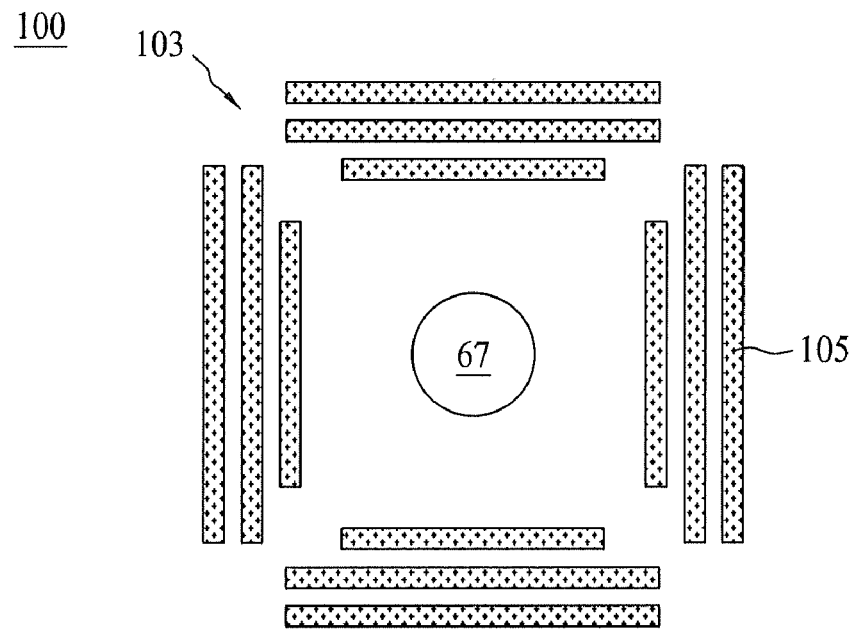
FIG. 12 is a top view showing a portion of an integrated circuit device in accordance with one embodiment of the present invention.

FIG. 12 is a top view showing a portion of an integrated circuit device 100 in accordance with one embodiment of the present invention. Compared to the integrated circuit device 60 in FIG. 6, which uses the concentric metal rings 75A and 75B to implement the heat-evacuating structure 73, the integrated circuit device 100 uses a plurality of parallel metal lines 105 around the conductive via 67 to implement the heat-evacuating structure 103.

Figure 13:
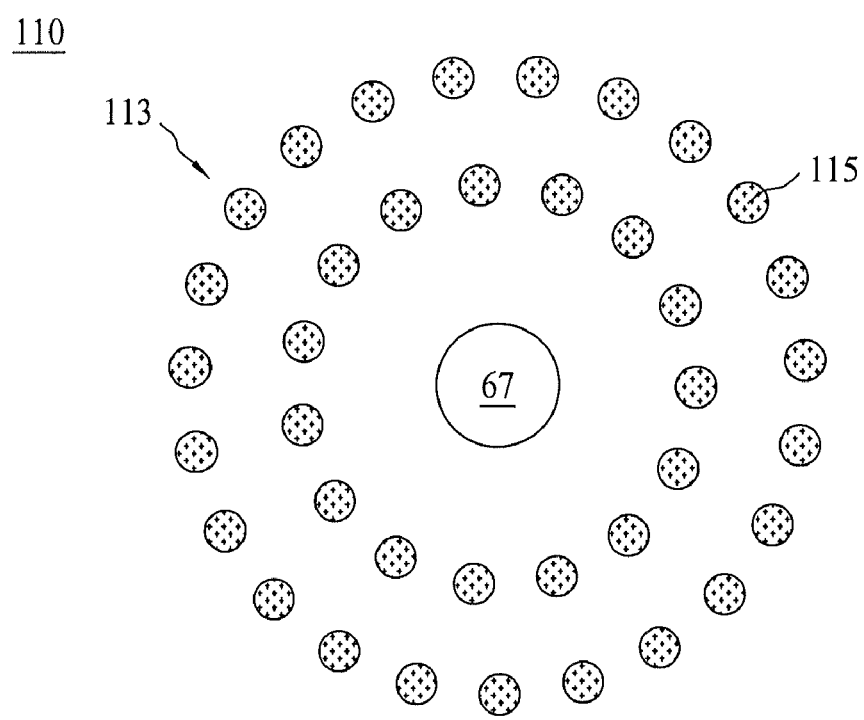
FIG. 13 is a top view showing a portion of an integrated circuit device in accordance with one embodiment of the present invention.

FIG. 13 is a top view showing a portion of an integrated circuit device 110 in accordance with one embodiment of the present invention. Compared to the integrated circuit device 60 in FIG. 6, which uses the concentric metal rings 75A and 75B to implement the heat-evacuating structure 73, the integrated circuit device 100 uses a plurality of metal blocks 115 positioned concentrically around the conductive via 67 to implement the heat-evacuating structure 113.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An integrated circuit device, comprising:
   a semiconductor substrate having a first region and a second region;
   a conductive via positioned in the first region of the semiconductor substrate;
   at least one active element positioned in the second region of the semiconductor substrate;
   a conductive layer extending from the first region to the second region and electrically connecting the conductive via to the active element; and
   an auxiliary structure positioned in the first region of the semiconductor substrate and proximate to the conductive via, wherein the auxiliary structure is configured to reduce the thermal influence from the operating heat of the active element.

2. The integrated circuit device of claim 1, wherein the auxiliary structure comprises a conductive element and a dielectric element between the conductive element and the semiconductor substrate.

3. The integrated circuit device of claim 2, wherein the conductive element comprises a first block and a second block.

4. The integrated circuit device of claim 2, wherein the dielectric element is sandwiched in between the semiconductor substrate and the conductive via.

5. The integrated circuit device of claim 2, wherein the auxiliary structure connects to the conductive layer.

6. The integrated circuit device of claim 2, wherein the auxiliary structure further comprises a plug connecting the conductive element to the conductive layer.

7. The integrated circuit device of claim 2, wherein the conductive element is surrounded by the dielectric element.

8. The integrated circuit device of claim 2, wherein the conductive element is encapsulated by the dielectric element.

9. The integrated circuit device of claim 2, wherein the auxiliary structure is positioned between the conductive via and the active element.

10. The integrated circuit device of claim 1, wherein the auxiliary structure includes a plurality of holes.

11. The integrated circuit device of claim 1, wherein the auxiliary structure comprises at least one ring around the conductive via.

12. The integrated circuit device of claim 1, wherein the auxiliary structure comprises a plurality of trenches.

13. The integrated circuit device of claim 1, further comprising a pad and a plurality of metal lines connecting the auxiliary structure to the pad.

* * * * *